(12) United States Patent
Ito

(10) Patent No.: US 7,901,866 B2
(45) Date of Patent: Mar. 8, 2011

(54) PATTERN FORMING METHOD

(75) Inventor: Toshiki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 41 days.

(21) Appl. No.: 11/913,922

(22) PCT Filed: Oct. 10, 2007

(86) PCT No.: PCT/JP2007/070219
§ 371 (c)(1),
(2), (4) Date: Nov. 8, 2007

(87) PCT Pub. No.: WO2008/047817
PCT Pub. Date: Apr. 24, 2008

(65) Prior Publication Data
US 2009/0311633 A1   Dec. 17, 2009

(30) Foreign Application Priority Data
Oct. 10, 2006   (JP) .................. 2006-276896

(51) Int. Cl.
G03F 7/00  (2006.01)
G03F 7/004 (2006.01)
B05D 3/00  (2006.01)
B05D 3/06  (2006.01)

(52) U.S. Cl. .............. 430/270.1; 430/312; 430/331; 427/558; 427/532; 427/331

(58) Field of Classification Search ........... 430/270.1, 430/311, 313, 312; 427/331, 532, 558
See application file for complete search history.

(56) References Cited

U.S. PATENT DOCUMENTS
5,378,502 A   1/1995 Willard et al.
(Continued)

FOREIGN PATENT DOCUMENTS
EP   1437625 A1 *  7/2004
(Continued)

OTHER PUBLICATIONS

Mark P. Stoykovich, et al., "Directed Assembly of Block Copolymer Blends into Nonregular Device-Oriented Structures", Science, vol. 308, Jun. 3, 2005, pp. 1442-1446. (with Supporting Online Material, pp. 1-8).

(Continued)

*Primary Examiner* — Amanda C. Walke
(74) *Attorney, Agent, or Firm* — Fitzpatrick, Cella, Harper & Scinto

(57) ABSTRACT

A pattern forming method includes a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation; a step of selectively exposing the photosensitive organic material layer to light in a pattern to generate the hydrophilic group at an exposed portion; a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and a step of removing one of the separated segments to form a pattern of the other segment.

16 Claims, 1 Drawing Sheet

U.S. PATENT DOCUMENTS

| | | | |
|---|---|---|---|
| 6,755,953 B2 | 6/2004 | Baba | |
| 6,926,953 B2 * | 8/2005 | Nealey et al. | 428/220 |
| 7,079,250 B2 | 7/2006 | Mukai | |
| 7,204,915 B2 | 4/2007 | Kitade et al. | |
| 7,405,034 B2 * | 7/2008 | Yan et al. | 430/312 |
| 2004/0131967 A1 * | 7/2004 | Ozaki | 430/270.1 |
| 2007/0134420 A1 * | 6/2007 | Koberstein et al. | 427/258 |
| 2007/0212806 A1 | 9/2007 | Ito | |
| 2007/0218373 A1 | 9/2007 | Ito et al. | |
| 2007/0218398 A1 * | 9/2007 | Ito et al. | 430/141 |

FOREIGN PATENT DOCUMENTS

| | | | |
|---|---|---|---|
| JP | 61065891 A * | 4/1986 | |
| JP | 2001-168317 | 6/2001 | |
| JP | 2002-80481 | 3/2002 | |
| JP | 2003-268592 | 9/2003 | |
| JP | 2003292496 A * | 10/2003 | |
| JP | 2003-321479 | 11/2003 | |
| JP | 2005-190624 | 7/2005 | |
| JP | 2007233125 A * | 9/2007 | |
| WO | 03/023518 | 3/2003 | |

OTHER PUBLICATIONS

Young-Hye La, et al., "Directed Assembly of Cylinder-Forming Block Copolymer Films and Thermochemically Induced Cylinder to Sphere Transition: A Hierarchical Route to Linear Arrays of Nanodots", Nano Letters, vol. 5, No. 7, 2005, pp. 1379-1384.

Aurèlien Blanc, et al., "Wavelength-Controlled Orthogonal Photolysis of Protecting Groups", J. Org. Chem. vol. 67, 2002, pp. 5567-5577. (with Supplementary material, pp. S1-S77).

Alan R. Katritzky, "Model Compounds of Caged Capsaicin: Design, Synthesis, and Photoreactivity", J. Org. Chem., vol. 68, 2003, pp. 9100-9104.

Grant A. Krafft, et al., "Photoactivable Fluorophores. 3. Synthesis and Photoactivation of Fluorogenic Difunctionalized Fluoresceins", J. Am. Chem. Soc., vol. 110, 1988, pp. 301-303.

H. Gokan, "Dry Etch Resistance of Organic Materials", J. Electrochem. Soc., Solid-State Science and Technology, vol. 130, No. 1, Jan. 1983, pp. 143-146.

Ferdinand Schmidt-Kaler, et al., "Realization of the Cirac-Zoller controlled-NOT quantum gate", Nature, vol. 422, Mar. 27, 2003, pp. 408-411.

Aránzazu del Campo, et al., "Surface Modification with Orthogonal Photosensitive Silanes for Sequential Chemical Lithography and Site-Selective Particle Deposition", Angew. Chem. Int. ed., vol. 44, 2005, pp. 4707-4712.

Li-Wen Chang, et al., "Diblock Copolymer Directed Self-Assembly for CMOS Device Fabrication", Proc. of SPIE, vol. 6156, 2006, pp. 615611-1-615611-6.

Erik W. Edwards, "Mechanism and Kinetics of Ordering in Diblock Copolymer Thin Films on Chemically Nanopatterned Substrates", Journal of Polymer Science, Part B, Polymer Physics, vol. 43, 2005, pp. 3444-3459.

Jamila Jennane, et al., "Photolithography of self-assembled monolayers: optimization of protecting groups by an electroanalytical method", Can. J. Chem., vol. 74, 1996, pp. 2509-2517.

PCT International Search Report and Written Opinion of the International Searching Authority, Mailing Date Feb. 14, 2008.

U.S. Appl. No. 10/585,644, International Filing Date Jun. 7, 2006, Ito, et al.

U.S. Appl. No. 11/866,002, filed Oct. 2, 2007, Yamaguchi, et al.

U.S. Appl. No. 12/021,250, filed Jan. 28, 2008, Ito et al.

U.S. Appl. No. 12/021,269, filed Jan. 28, 2008, Ito, et al.

* cited by examiner

PATTERN FORMING METHOD

TECHNICAL FIELD

The present invention relates to a pattern forming method using a block polymer.

BACKGROUND ART

In recent years, in the fields of various electronic devices, such as a semiconductor device, requiring fine processing, demands for high density and high integration of the devices are more and more increased.

In a semiconductor production process, a step playing an important role in forming a minute circuit pattern is a photolithographic step.

A current photographic step is performed principally by reduced (size) projection exposure but a resolution thereof is restricted by diffraction limit of light and is about ⅓ of a light source wavelength.

For this reason, the wavelength can be shortened by using an excimer laser or the like as an exposure light source, so that fine processing on the order of about 100 nm can be performed.

Thus, lithography is advanced in level of the fine processing but with a shorter light source wavelength, is accompanied with many problems such as an increase in size of a device, development of a lens in an associated wavelength region, a device cost, a corresponding resist cost, etc.

Further, in recent years, the following devices requiring a high density hole array pattern or dot array pattern have been proposed.

A single electronic device has been disclosed in Japanese Laid-Open Patent Application (JP-A) 2001-168317, patterned media have been disclosed in JP-A 2005-190624, and a chemical sensor has been disclosed in JP-A 2003-268592. Further, a quantum dot laser device and a photonic crystal optical device have also been proposed.

However, these devices require higher precision fine processing technique than the semiconductor device, so that it is difficult to produce these devices in volume by the conventional lithographic technique.

On the other hand, as a cost-reduced and simple fine processing technique in place of the conventional lithographic technique, a method of arranging fine particles in a self-organizing manner or a method utilizing a microphase-separated structure formed by a block polymer has been reported.

Further, in recent years, a combined technique of the lithography with the self-organization has also been proposed. More specifically, Nature, 422, 411 (2003); Science, 308, 1442 (2005); and Nano Letters, 5, 1379 (2005) have disclosed that a chemically active group is formed in a pattern on a substrate and a minute pattern is formed by utilizing an interaction of the chemically active group with a block polymer.

These documents specifically disclose the following method.

By using, as a mask, a line-and-space resist pattern formed by lithography using extreme-ultraviolet (EUV), oxygen plasma ashing of an underlying substrate is performed. Then, at a surface of the substrate, a chemically active pattern comprising a hydrophilic portion and a hydrophobic portion is formed. Thereafter, the resist pattern is removed and then on the substrate, a block polymer having a polymethyl mathacrylate segment as a hydrophilic block and a polystyrene segment as a hydrophobic block is developed. Then, a regular phase-separated structure (a pattern having a hydrophilic block area and a hydrophobic block area) of the block polymer regulated by the chemically active pattern at the substrate surface is formed. In this method, a line-and-space pattern with a period of 47.5 nm or a hole pattern with a period of 55 nm is formed. In the case where the above described block polymer is developed on a substrate on which no chemically active pattern is formed, a disordered lamella pattern is formed.

In the method described in the above mentioned documents, the pattern of the chemically active group is formed at the substrate surface. For this purpose, a photolithographic step using a resist is required. That is, steps of resist application, baking, pattern exposure, and development are needed, thus being increased in the number thereof. For this reason, simplification of the steps is desired.

DISCLOSURE OF THE INVENTION

A principal object of the present invention is to provide a pattern forming method capable of forming a pattern of a chemically active group at a substrate surface only by pattern exposure and capable of forming a phase-separated structure of a block polymer regulated by the chemically active group pattern formed at the substrate surface.

According to an aspect of the present invention, there is provided a pattern forming method, comprising:

a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;

a step of selectively exposing the photosensitive organic material layer to light in a pattern to generate the hydrophilic group at an exposed portion;

a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and a step of removing one of the separated segments to form a pattern of the other segment.

According to the present invention, it is possible to provide a pattern forming method capable of forming a pattern of a chemically active group at a substrate surface only by pattern exposure and capable of forming a phase-separated structure of a block polymer regulated by the chemically active group pattern formed at the substrate surface.

These and other objects, features and advantages of the present invention will become more apparent upon a consideration of the following description of the preferred embodiments of the present invention taken in conjunction with the accompanying drawings.

BEST MODE FOR CARRYING OUT THE INVENTION

Figure 1:
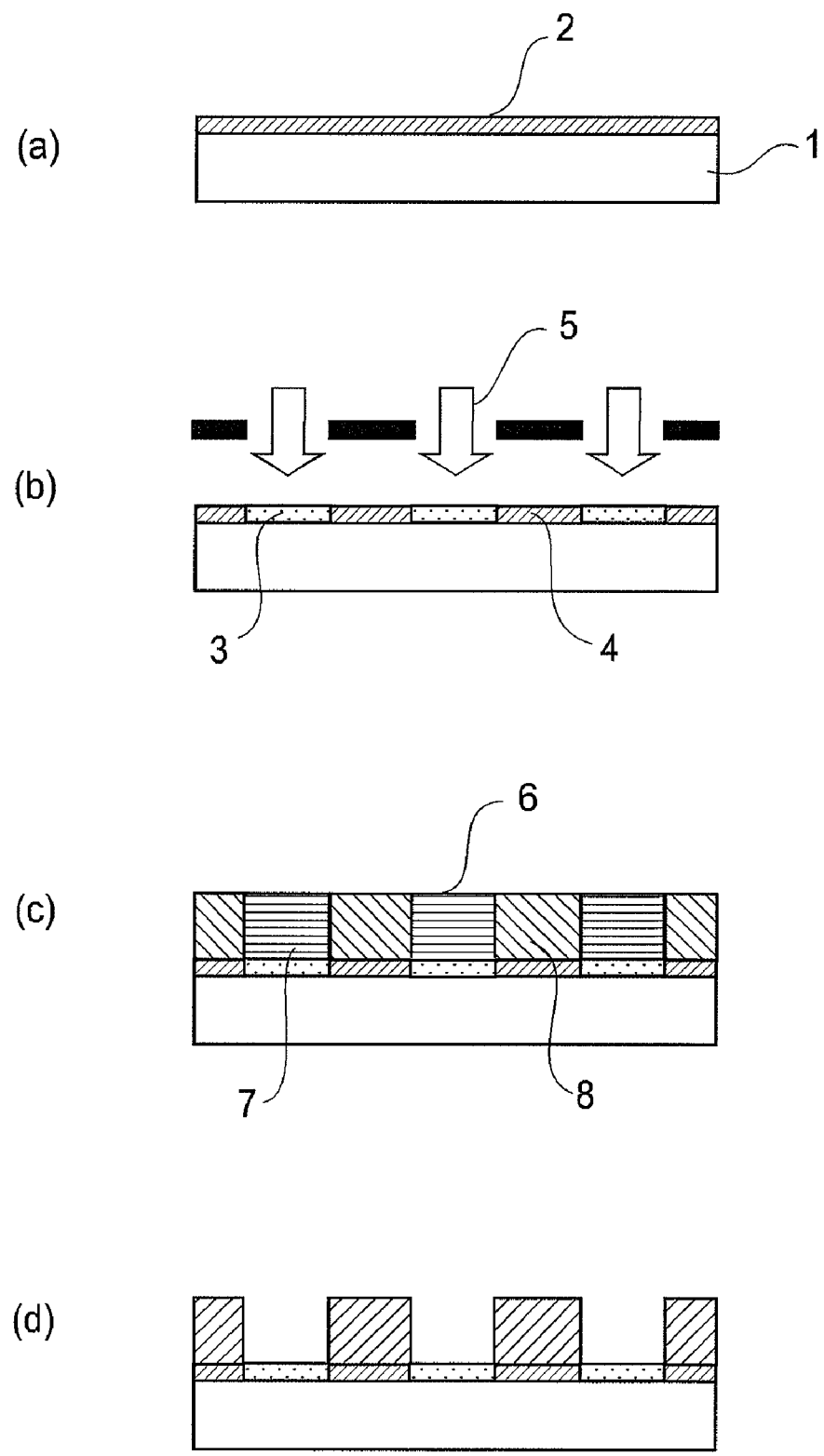
FIGS. 1(a) to 1(d) are schematic views showing steps for illustrating a pattern forming method according to an embodiment of the present invention.

Hereinbelow, the present invention will be described more specifically.

The pattern forming method according to the present invention is characterized by including the following first to fourth steps.

Step 1: a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation.

Step 2: a step of selectively exposing the photosensitive organic material layer of light in a pattern to generate the hydrophilic group at an exposed portion. In this step, a non-exposed portion is still hydrophobic.

Step 3: a step of providing a block polymer having a hydrophilic segment and a hydrophobic segment on the photosensitive organic material layer after the exposure. In this step, a hydrophilic segment area is formed at a portion where the hydrophilic group generated by the exposure is present, and a hydrophobic segment area is formed at a hydrophobic portion where the hydrophilic group is not present. In this step, segments of the block polymer are separated into the hydrophilic segment and the hydrophobic segment. As a result, a regular phase-separated structure having a hydrophilic block of the block polymer and a hydrophobic block of the block polymer is formed.

Step 4: a step of removing one of the separated segments to form a pattern of the other segment.

Hereinbelow, the photosensitive organic material used in Step 1 in the present invention will be described.

As the photosensitive organic material, it is possible to a photosensitive silane coupling agent (A) capable of generating a hydrophilic group selected from the group consisting of amino group, hydroxyl group, carboxyl group, and sulfo group, and a photosensitive silane coupling agent (B) containing 1,2-naphthoquinone-2-diazide-5-sulfonyl group or 1,2-naphthoquinone-2-diazide-4-sulfonyl group.

The photosensitive silane coupling agent (A) in the present invention has such a structure before exposure that the amino group, the hydroxyl group, the carboxyl group, or the sulfo group is protected by a hydrophobic photogradable group but is characterized in that the above described hydrophilic group is generated by the exposure. From the viewpoint of a hydrophilic/hydrophobic contrast between an exposed portion and a non-exposed portion, it is preferable that the photosensitive silane coupling agent (A) does not have the amino group, the hydroxyl group, the carboxyl group, or the sulfo group.

The photosensitive silane coupling agent (A) can be synthesized through known synthetic methods such as those described in JP-A 2003-321479; JP-A 2002-80481; Journal of Organic Chemistry, 67, 5567 (2002); Journal of Organic Chemistry, 68, 9100 (2003); Journal of the American Chemical Society, 110, 301 (1988). These methods may be employed singly or in combination of two or more methods.

Preferred examples of the photosensitive silane coupling agent (A) are shown below.

The photosensitive silane coupling agent (A) may preferably be a photosensitive silane coupling agent (A1) represented by the following formula (1):

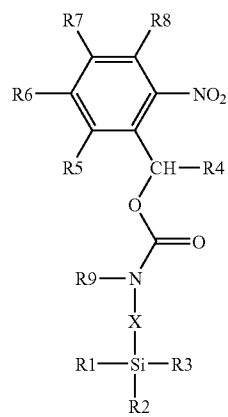

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; R4 represents hydrogen atom or alkyl group; R5, R6, R7, and R8 are selected from the group consisting of nitro group, hydrogen atom, halogen atom, alkyl group, alkyl group containing hydrogen atoms partially or entirely substituted with fluorine atom, and alkoxy group containing hydrogen atoms partially or entirely substituted with fluorine atom; and R9 represents hydrogen atom or alkyl group.

Further, the photosensitive silane coupling agent (A) may preferably be a photosensitive silane coupling agent (A2) represented by the following formula (2):

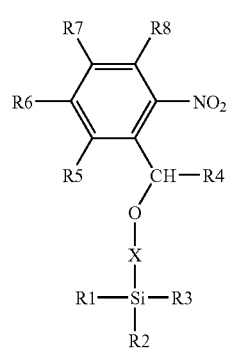

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; R4 represents hydrogen atom or alkyl group; and R5, R6, R7, and R8 are selected from the group consisting of nitro group, hydrogen atom, halogen atom, alkyl group, alkyl group containing hydrogen atoms partially or entirely substituted with fluorine atom, and alkoxy group containing hydrogen atoms partially or entirely substituted with fluorine atom.

The photosensitive silane coupling agent (A) may preferably be a photosensitive silane coupling agent (A3) represented by the following formula (3):

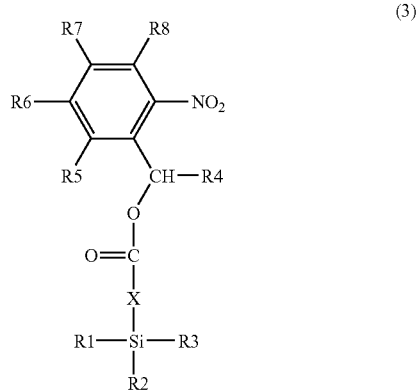

(3)

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; R4 represents hydrogen atom or alkyl group; and R5, R6, R7, and R8 are selected from the group consisting of nitro group, hydrogen atom, halogen atom, alkyl group, alkyl group containing hydrogen atoms partially or entirely substituted with fluorine atom, and alkoxy group containing hydrogen atoms partially or entirely substituted with fluorine atom.

The photosensitive silane coupling agent (A) may preferably be a photosensitive silane coupling agent (A4) represented by the following formula (4):

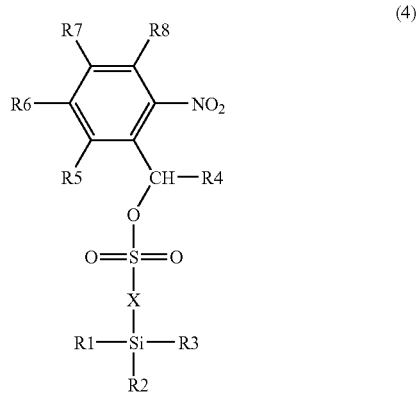

(4)

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; R4 represents hydrogen atom or alkyl group; and R5, R6, R7, and R8 are selected from the group consisting of nitro group, hydrogen atom, halogen atom, alkyl group, alkyl group containing hydrogen atoms partially or entirely substituted with fluorine atom, and alkoxy group containing hydrogen atoms partially or entirely substituted with fluorine atom.

The photosensitive silane coupling agent (A) may preferably be a photosensitive silane coupling agent (A5) represented by the following formula (5):

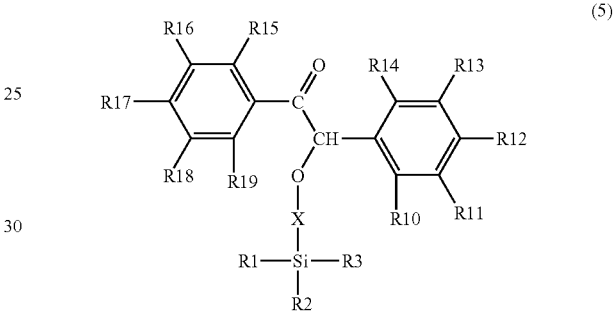

(5)

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; and R10 to R19 are selected from the group consisting of hydrogen atom, fluorine atom, alkoxy group, and thioalkoxy group.

The photosensitive silane coupling agent (A) may preferably be a photosensitive silane coupling agent (A6) represented by the following formula (6):

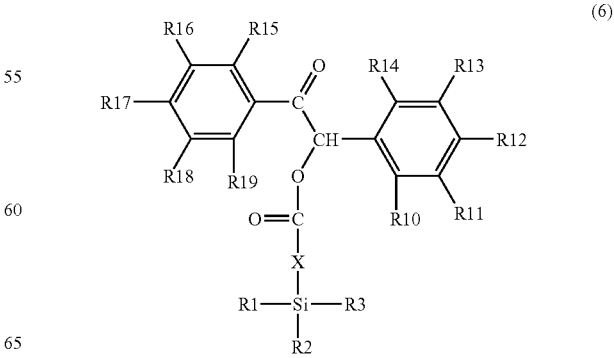

(6)

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; and R10 to R19 are selected from the group consisting of hydrogen atom, fluorine atom, alkoxy group, and thioalkoxy group.

The photosensitive silane coupling agent (A) may preferably be a photosensitive silane coupling agent (A7) represented by the following formula (7):

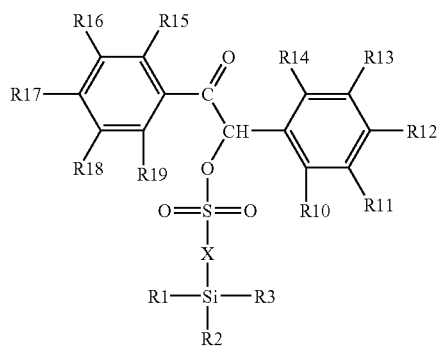

(7)

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; and R10 to R19 are selected from the group consisting of hydrogen atom, fluorine atom, alkoxy group, and thioalkoxy group.

The photosensitive silane coupling agent (B) in the present invention contains 1,2-naphthoquinone-2-diazide-5-sulfonyl group (referred to as "5-DNQ group") and 1,2-naphtho-quinone-2-diazide-4-sulfonyl group (referred to as "4-DNQ group"). The 5-DNQ group or the 4-DNQ group is hydrophobic before the exposure but causes transfer by the exposure to generate carboxyl group, thus being hydrophilic after the exposure.

Preferred examples of the photosensitive silane coupling agent (B) are shown below.

The photosensitive silane coupling agent (B) may preferably be a photosensitive silane coupling agent (B1) represented by the following formula (8):

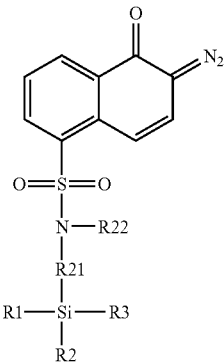

(8)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of alkylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R22 represents hydrogen atom or alkyl group.

The photosensitive silane coupling agent (B) may preferably be a photosensitive silane coupling agent (B2) represented by the following formula (9):

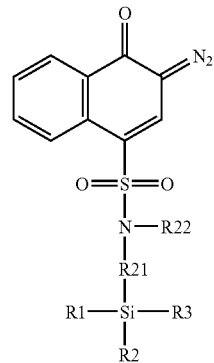

(9)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of alkylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R22 represents hydrogen atom or alkyl group.

The photosensitive silane coupling agent (B) may preferably be a photosensitive silane coupling agent (B3) represented by the following formula (10):

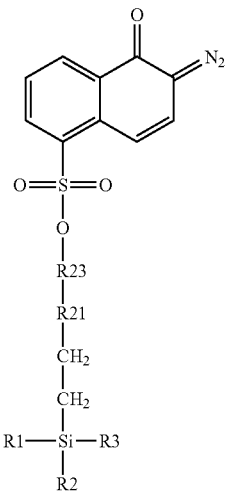

(10)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of alkylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R23 represents methylene group partially having hydrogen atom optionally substituted with fluorine atom or alkyl group, or alkylene group partially having hydrogen atom optionally substituted with fluorine atom or alkyl group.

The photosensitive silane coupling agent (B) may preferably be a photosensitive silane coupling agent (B4) represented by the following formula (11):

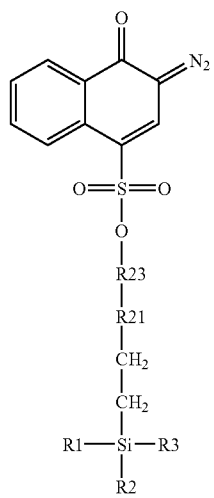

(11)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R23 represents methylene group partially having hydrogen atom optionally substituted with fluorine atom or alkyl group, or alkylene group partially having hydrogen atom optionally substituted with fluorine atom or alkyl group.

The photosensitive silane coupling agent (B) may preferably be a photosensitive silane coupling agent (B5) represented by the following formula (12):

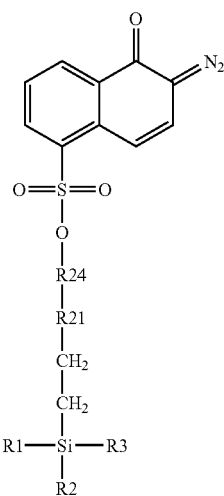

(12)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of alkylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R24 represents phenylene group partially having hydrogen atom optionally substituted with fluorine atom or alkyl group, or naphthylene group partially having hydrogen atom optionally substituted with fluorine atom or alkyl group.

The photosensitive silane coupling agent (B) may preferably be a photosensitive silane coupling agent (B6) represented by the following formula (13):

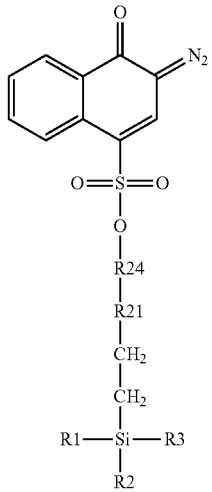

(13)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of alkylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R24 represents phenylene group partially having hydrogen atom optionally substituted with fluorine atom or alkyl group, or naphthylene group partially having hydrogen atom optionally substituted with fluorine atom or alkyl group.

Hereinbelow, a synthetic method of the photosensitive silane coupling agent (B) in the present invention will be described more specifically.

The photosensitive silane coupling agent (B1) can be obtained through a reaction formula (b1) shown below by reacting 1,2-naphthoquinone-2-diazide-5-sulfonyl chloride (21) with a compound (22) at room temperature in the presence of tertiary amine such as triethylamine or dimethylaminopyridine. The 1,2-naphthoquinone-2-diazide-5-sulfonyl chloride (21), triethylamine, and dimethylaminopyridine are commercially available. Examples of the compound (22) may include aminophenyltrimethoxysilane, 3-amino-propyldimethylethoxysilane, 3-aminopropylmethyldiethoxysilane, 3-aminopropyltriethoxysilane, 3-aminopropyltriethoxysilane, N-methylaminopropyl-methyldimethoxilane, and N-ethylaminoisobutyl-trimethoxysilane. These silane compounds are commercially available but the compound (22) in the present invention is not limited thereto.

In the formula (b1), R1 to R3 have the same meanings as those in the formula (1), and R21 and R22 have the same meanings as those in the formula (8).

The photosensitive silane coupling agent (B2) can be synthesized in the same manner as in the case of the photosensitive silane coupling agent (B1) except that 1,2-naphthoquinone-2-diazide-4-sulfonyl chloride is used instead of the 1,2-naphthoquinone-2-diazide-5-sulfonyl chloride (21). 1,2-naphthoquinone-2-diazide-4-sulfonyl chloride is commercially available.

The photosensitive silane coupling agent (B3) can be obtained through reaction formulas (b2) and (b3) shown below by reacting a compound (24) with a compound (25) in the presence of platinum (IV) chloride hexahydrate (H$_2$PtCl$_6$.6H$_2$O) as a catalyst. The compound (24) can be obtained by reacting the 1,2-naphthoquinone-2-diazide-5-sulfonyl chloride (21) with a compound (23) at room temperature in the presence of tertiary amine such as triethylamine or dimethylaminopyridine. Examples of the compound (23) may include commercially available compounds such as allyl alcohol, 2-butenol, 4-pentenol, and 10-undecenol but the compound (23) is not limited thereto. Examples of the compound (25) may include commercially available compounds such as trimethoxysilane, triethoxysilane, methyldiethoxysilane, dimethylethoxysilane, trichlorosilane, dichloromethylsilane, and chlorodimethylsilane but the compound (25) is not limited thereto.

(b2)

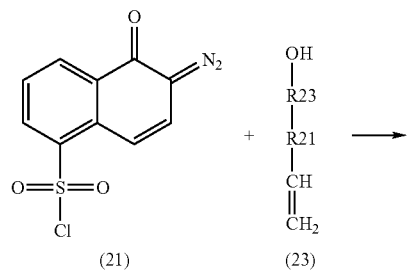

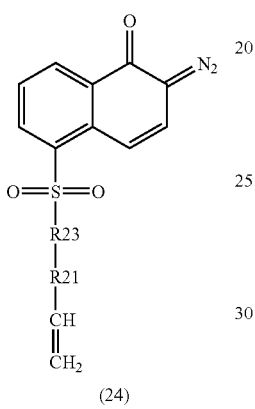

In the formula (b2), R21 has the same meaning as that in the formula (8) and R23 has the same meaning as that in the formula (10).

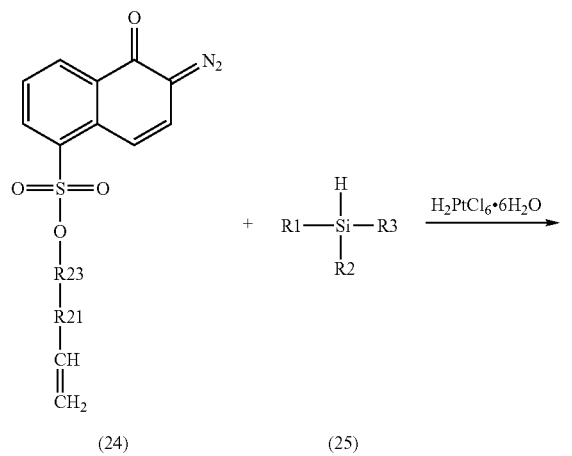

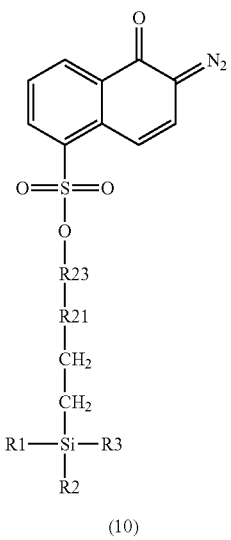

In the formula (b3), R21 has the same meaning as that in the formula (8) and R23 has the same meaning as that in the formula (10).

The photosensitive silane coupling agent (B4) can be synthesized in the same manner as in the case of the photosensitive silane coupling agent (B1) except that 1,2-naphthoquinone-2-diazide-4-sulfonyl chloride is used instead of the 1,2-naphthoquinone-2-diazide-5-sulfonyl chloride (21).

The photosensitive silane coupling agent (B5) can be obtained through reaction formulas (b4) and (b5) shown below by reacting a compound (27) with the above described compound (25) in the presence of platinum (IV) chloride hexahydrate ($H_2PtCl_6 \cdot 6H_2O$) as a catalyst. The compound (27) can be obtained by reacting the 1,2-naphthoquinone-2-diazide-5-sulfonyl chloride (21) with a compound (26) at room temperature in the presence of tertiary amine such as triethylamine or dimethylaminopyridine. Examples of the compound (26) may include commercially available compounds such as 4-vinylphenol, 2-allylphenol, 4-allyl-2,6-dimethoxyphenol, 3-allyl-4-hydroxyacetophenone, and 2-ethoxy-5-(1-propenyl)phenol but the compound (26) is not limited thereto.

-continued

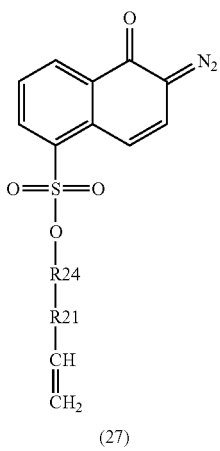

(27)

In the formula (b4), R21 has the same meaning as that in the formula (8) and R24 has the same meaning as that in the formula (12).

(b5)

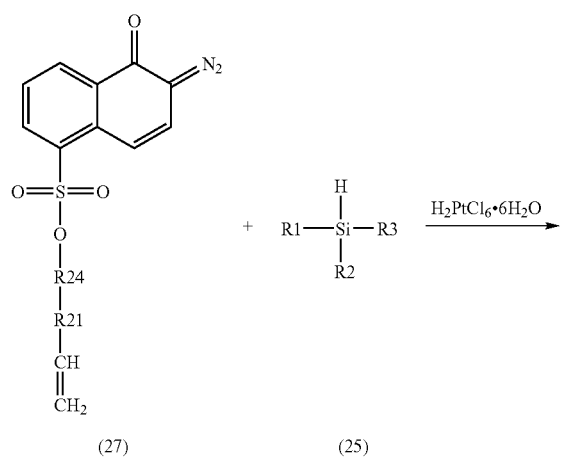

(27)                (25)

(12)

In the formula (b5), R21 has the same meaning as that in the formula (8) and R24 has the same meaning as that in the formula (12).

The photosensitive silane coupling agent (B6) can be synthesized in the same manner as in the case of the photosensitive silane coupling agent (B5) except that 1,2-naphthoquinone-2-diazide-4-sulfonyl chloride is used instead of the 1,2-naphthoquinone-2-diazide-5-sulfonyl chloride (21).

Hereinbelow, the block polymer used in Step 3 in the present invention will be described.

The block polymer has a hydrophilic segment and a hydrophobic segment.

A hydrophilic monomer constituting the hydrophilic segment of the block polymer is selected from the group consisting of acrylic acid, methacrylic acid, itaconic acid, fumaric acid, crotonic acid, maleic acid, 2-acrylamide-2-methylpropanesulfonic acid, styrenesulfonic acid, vinylsulfonic acid, vinylphosphonic acid, hydroxyalkyl acrylate, hydroxyalkyl methacrylate, methyl acrylate, methyl methacrylate, sodium acrylate, sodium methacrylate, dimethyldiallylammonium chloride, methylvinylimidazolium chloride, 2-vinylpyridine, 4-vinylpyridine, 2-methyl-5-vinylpyridine, vinylamine, N-alkyl-vinylpyridinium iodide, acrylamide, methacrylamide, N,N-dialkylacrylamide, N,N-dialkylacrylamide, ethylene oxide, polyethylene glycol acrylate, polyethylene glycol methacrylate, N-vinylacetoamide, N-methyl-N-vinylacetoamide, N-vinylformamide, N-methyl-N-vinylformamide, N-vinyl lactam containing a cyclic group having 4-9 carbon atoms, and vinyl alcohol. These monomers may be used singly or in mixture of two or more species of different monomers.

A hydrophobic monomer constituting the hydrophobic segment of the block polymer is selected from the group consisting of aromatic vinyl monomer inclusive of styrene or alkyl derivative such as 4-butylstyrene, α-methylstyrene, vinyltoluene, vinylnaphthalene, ethylene, propylene, butadiene, dimethylbutadiene, isoprene, 1,3-hexadiene, isobutylene, or chloroprene; propylene oxide; $C_2$ to $C_{10}$ alkyl group, $C_6$ to $C_{10}$ allyl group, $C_6$ to $C_{10}$ aralkyl acrylate, or $C_6$ to $C_{10}$ aralkyl methacrylate, such as ethyl, n-butyl, 2-ethylhexyl, tert-butyl, isobornyl, phenyl, benzyl, or (meth)acrylate; fluorinated or perfluoro chain-containing vinyl monomer such as fluoroalkyl acrylate, fluoroalkyl methacrylate, or alkyl α-fluoroacrylate; vinyl acetate; $C_1$ to $C_6$ alkyl vinyl ether; $C_1$ to $C_6$ alkyl allyl ether; acrylonitrile; vinyl chloride; vinylidene chloride; caprolactone; dimethylsiloxane; methylphenylsiloxane; diphenylsiloxane; methylphenylsilane; diphenylsilane; methylchloromethylphenylsilane; dihexylsilane; propylmethylsilane; dibutylsilane; methylsilane; and phenylsilane. These monomers may be used singly or in mixture of two or more species of different monomers.

The hydrophilic segment of the block polymer may preferably comprise polymethyl methacrylate, polymethacrylic acid, or polyhydroethyl methacrylate, and the hydrophobic segment of the block polymer may preferably comprise polystyrene or polydimethylsiloxane.

The block polymer can be synthesized through various polymerization processes. An optimum polymerization process is living polymerization. In living anionic or cationic polymerization, polymerization of one species of monomer is initiated by a polymerization initiator capable of generating anion or cation and another monomer is added in succession, thus synthesizing a block polymer. It is also possible to employ living radical polymerization. In the living polymerizations, it is possible to precisely control a molecular weight or a copolymer ratio, so that a block polymer having a narrow molecular weight distribution can be synthesized. When the living polymerization is employed, it is preferable that a solvent is sufficiently dried with a drying agent such as metallic sodium and inclusion of oxygen is prevented by a method such as freeze drying or inert gas bubbling. A polymerization reaction may also be performed under a condition of inert gas stream and a pressurized condition. The pressurized condition is preferable since it can effectively prevent inclusion of water content or oxygen from the outside of a reaction vessel and permits a reaction process at a relatively low cost.

The block polymer used in the present invention is a multi-component block polymer such as two-block polymer represented by formula AB, three-block polymer represent by formula ABA or formula BAB, or a block polymer having alternately arranged at least two hydrophilic blocks and at least two hydrophobic blocks. Each block A is a hydrophilic block having a recurring unit of hydrophilic monomer and each block B is a hydrophobic block having a recurring unit of hydrophobic monomer. The blocks A of the same block polymer may be the same or different and the blocks B of the same block polymer may also be the same or different. In the present invention, the two-block polymer represented by formula AB is particularly preferred.

The block polymer has the hydrophilic segment and the hydrophobic segment. Each block which is hydrophilic or hydrophobic and is a copolymer or a homopolymer may preferably have a number-average molecular weight (Mn) of 500 or more and 3,000,000 or less, particularly 500 or more and 500,000 or less and may preferably have a molecular distribution (Mw/Mn, Mw: weight-average molecular weight) of 1.01 or more and 1.2 or less, particularly 1.01 or more and 1.15 or less.

The block polymer used in the present invention may preferably have a block copolymer composition which forms a lamella-like phase-separated structure. More specifically, a molar ratio between the hydrophilic block A and the hydrophobic block B (A:B) may preferably be 3:7 to 7:3, particularly 4:6 to 6:4.

It has been known that a smaller value of N/(Nc−No) of monomer unit (N: total number of atoms of monomer unit, Nc: number of carbon atoms of monomer unit, No: number of oxygen atoms of monomer unit) provides a lower dry etching rate (Journal of Electrochemical Society, 130, 143 (1983)). The value of N/(Nc−No) is generally called "Ohnishi parameter". Incidentally, by using the Ohnishi parameter, a dry etching rate of a polymer containing inorganic element such as silicon, quartz, or metal cannot be evaluated.

The block polymer used in the present invention may preferably have a larger ratio between the Ohnishi parameter of the hydrophilic block and the Ohnishi parameter of the hydrophobic block, particularly the Ohnishi parameter ratio of 1.4 or more. For example, methyl methacrylate has the Ohnishi parameter of 5 and styrene has the Ohnishi parameter of 2, so that a block polymer obtained from methylmethacrylate as a monomer for the hydrophilic block and styrene as a monomer for the hydrophobic block has an Ohnishi parameter ratio of 2.5. Further, ethylene oxide has the Ohnishi parameter of 7, so that a block polymer obtained from ethylene oxide (the hydrophilic block monomer) and styrene (the hydrophobic block monomer) has an Ohnishi parameter ratio of 3.5. These two block polymers are particularly preferable in the present invention.

In the case where $O_2$ is used as a dry etching gas, a block polymer having a block containing inorganic element such as silicon and an organic block containing no inorganic element may preferably be used. An inorganic element-containing compound has a high $O_2$ plasma resistance, so that a high-contrast pattern can be obtained.

Hereinbelow, the present invention will be described more specifically based on a specific embodiment.

Embodiment 1

A pattern forming method according to the present invention will be described with reference to FIGS. 1(a) to 1(d) showing steps for illustrating an embodiment of the pattern forming method.

In this embodiment, a photosensitive silane coupling agent is fixed on a substrate via a chemical bond (linkage).

As a substrate 1, it is possible to use a wide range of substrates including a semiconductor substrate of Si, GaAs, InP, or the like; an insulating substrate such as a glass substrate, a quartz substrate, or BN substrate; and these substrates coated with one or plural species of a resist, spin-on glass, metal, oxide, and nitride.

At the photosensitive silane coupling agent-fixed surface, it is desirable that a hydroxyl group is formed.

In order to form the hydroxyl group at the surface of the substrate 1, it is desirable that the substrate 1 is subjected to pretreatment.

The pretreatment is performed by exposing the substrate surface to an acidic solution or an ultraviolet ray-ozone environment. As the acidic solution, it is possible to use sulfuric acid, hydrochloric acid, nitric acid, hydrogen peroxide, etc. These may be used singly or in combination of two or more species but a combination of sulfuric acid and hydrogen peroxide may preferably be employed. Particularly, the combination of sulfuric acid and hydrogen peroxide is suitable for the pretreatment of an Si substrate. As a means of the pretreatment with the acidic solution, for example, it is possible to employ application, spraying, dipping, etc.

On the substrate 1, the photosensitive silane coupling agent is applied and heated to form a photosensitive silane coupling agent layer 2 (FIG. 1(a)).

The application of the photosensitive silane coupling agent can be performed according to dipping, spin coating, spray coating, vapor deposition, or the like by using a liquid of the photosensitive silane coupling agent alone or a solution of the photosensitive silane coupling agent in an organic solvent. In the present invention, the dipping or the spin coating may preferably be used.

After the photosensitive silane coupling agent is applied onto the substrate, it is preferable that the substrate is washed with an organic solvent, dried, and heated to complete a reaction of the photosensitive silane coupling agent with the hydroxyl group on the substrate. The heating is performed at 80-200° C., preferably 80-150° C., by using a heating means such as a hot plate or a hot gas dryer.

By the above described treatment, a monomolecular layer of the photosensitive silane coupling agent in the present invention is formed on the surface of the substrate.

The thus formed photosensitive silane coupling agent layer 2 is exposed to light 5 in a pattern by using a known exposure device (FIG. 1(b)). By the exposure, at an exposed portion 3, amino group, hydroxyl group, carboxyl group, or sulfo group is selectively generated.

The pattern is a line-and-space pattern. The pattern may also be curved or bent. A pitch of the exposure pattern may preferably be in the range of (pitch (lamella period) of phase-separated structure of block polymer)±10%. The lamella period is determined depending on a molecular weight of the block polymer but is typically 10-100 nm.

As radiation for exposure, it is possible to appropriately select and use visible ray, ultraviolet ray, far-ultraviolet ray, X-ray, electron beam, gamma-ray, molecular beam, ion beam, or the like. Particularly, it is preferable that mercury lamp light (wavelength: 436 nm, 365 nm, 254 nm), KrF excimer laser light (wavelength: 248 nm), ArF excimer laser light (wavelength: 193 nm), far-ultraviolet ray such as $F_2$ excimer laser light (wavelength: 157 nm) or extreme ultraviolet (EUV) ray (wavelength: 13 nm), or electron beam is used. These radiations may be used singly or in combination of two or more radiations.

As another exposure method, near-field light generated from a photomask provided with a light blocking layer having an opening width narrower than a wavelength of light from an exposure light source may preferably be used.

As radiation for near-field light exposure, the above described radiations can be used. These radiations can also be used singly or in combination of plural radiations. The exposure to the near-field light is carried out by bringing the light blocking layer of the photomask into intimate contact with an object to be exposed.

In order to obtain a finer pattern, it is preferable that exposure is performed by using short-wavelength light such as ArF excimer laser light, $F_2$ excimer laser light, EUV ray, or electron beam or using near-field light which is not influenced by diffraction light.

A near-field light exposure device is inexpensive since a precision optical system and an expensive light source are not required, thus being particularly preferred in the present invention from the viewpoint of productivity.

The above described exposure in the pattern (patternwise exposure) may preferably be performed by using the near-field light generated from the photomask provided with the light blocking layer having the opening width narrower than the wavelength of the light from the exposure light source.

By the exposure described above, at the exposed portion 3, a functional group selected from the group consisting of amino group, hydroxyl group, carboxyl group, and sulfo group is generated and fixed on the substrate in a pattern. As a result, the surface of the substrate at the exposed portion 3 is hydrophilic.

On the other hand, a non-exposed portion 4 where the above functional group (amino group, hydroxyl group, carboxyl group, or sulfo group) is not present is hydrophobic.

As described above, in the present invention, it is possible to form a chemically active group on a substrate surface in a pattern only be pattern exposure using the photosensitive silane coupling agent (A) or the photosensitive silane coupling agent (B).

Incidentally, in the case where a by-product is also generated at the exposed portion, the substrate after the exposure is completed is dipped into an organic solvent to remove the by-product, as desired.

A micro phase-separated structure of the block polymer is formed on the exposure-completed substrate in the following manner (FIG. 1(c)).

An application solution is prepared by dissolving the block polymer in a solvent and applied onto the substrate by spin coating or dip coating, followed by drying to form a film. In this case, the solvent may desirably be a good solvent with respect to each of the blocks of the block polymer.

The film thickness after annealing described later may preferably be ½ to 5 times the lamella period, particularly ½ to 2 times the lamella period.

It is possible to form a phase-separated structure regulated by the chemically active group generated by the patternwise exposure by subjecting the above formed film to annealing at a temperature not less than a glass transition temperature of the block polymer. More specifically, by providing a hydrophilic block 7 of a block polymer 6 at a hydrophilic site (the exposed portion) and providing a hydrophobic block 8 of the block polymer 6 at a hydrophobic site (the non-exposed portion), a line-and-space phase-separated structure which reflects the exposure pattern is formed. Further, the phase-separated structure is formed perpendicularly to the substrate, so that it is possible to form a projection/recess pattern with a high aspect ratio by selective removal of one block described later.

The annealing can be performed by a known heating means such as an oven or a hot plate.

In the case where the block polymer has a glass transition temperature not more than room temperature, a good phase-separated structure can be formed with no annealing. In the present invention, the photosensitive silane coupling agent can be degraded by the annealing, so that the glass transition temperature of the block polymer may particularly preferably be not more than room temperature.

The lamella period can be adjusted by mixing two or more species of block polymers different in molecular weight or copolymer composition or mixing a hydrophilic homopolymer and a hydrophobic homopolymer. The molecular weight of the homopolymer may preferably be smaller than that of a segment corresponding to the hydrophilic block or the hydrophobic block of the block polymer. In the case of adding the homopolymer, an amount of the homopolymer is set to be 100 wt. parts or less, preferably 50 wt. parts or less, particularly 10 wt. parts of less, per 100 wt. parts of the block polymer. When the addition amount of the homopolymer is excessively large, the resultant micro phase-separated structure can be disordered.

Then, only one block of the block polymer is removed (FIG. 1(d)). For this purpose, dry etching or energy line irradiation is employed. As the energy line, it is possible to preferably use electron beam, X-ray, γ-ray, or heavy particle beam, particularly electron beam. In order to form a high-contrast pattern by the dry etching, it is desirable that a dry etching rate ratio between the hydrophilic block and the hydrophobic block is increased.

As an etching gas, it is possible to use Ar, $O_2$, $CF_4$, $H_2$, $C_2F_6$, $CHF_3$, $CH_2F_2$, $CF_3Br$, $H_2$, $NF_3$, $Cl_2$, $CCl_4$, HBr, $SF_6$, etc. It has been known that an etching rate on the base of the Ohnishi parameter little depends on the type of the etching gas. In the case of using a block polymer having a block containing inorganic element such as silicon and an organic block containing no inorganic element, $O_2$ may preferably be used as the dry etching gas.

By using, as a mask, the pattern of the block polymer from which one segment is selectively removed, the substrate (e.g., the semiconductor substrate formed of silicon, germanium etc.) is subjected to the dry etching or wet etching. Further, the substrate is processed by performing a semiconductor process such as metal deposition, lift-off, or plating. As a result, it is possible to produce a desired device on the substrate.

INDUSTRIAL APPLICABILITY

According to the pattern forming method of the present invention in which the phase-separated structure of the block polymer regulated by the chemically active group pattern to be formed at the substrate surface is formed, it is possible to easily form the chemically active group pattern at the substrate surface only by the pattern exposure. As a result, the pattern forming method of the present invention can be utilized for producing electronic or optical devices having minute structures of several nanometers to several hundred nanometers.

While the invention has been described with reference to the structures disclosed herein, it is not confined to the details set forth and this application is intended to cover such modifications or changes as may come within the purpose of the improvements or the scope of the following claims.

The invention claimed is:

1. A pattern forming method, comprising:
a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;
a step of selectively exposing the photosensitive organic material layer to light in a pattern to generate the hydrophilic group at an exposed portion;
a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and
a step of removing one of the separated segments to form a pattern of the other segment,
wherein the photosensitive organic material is a photosensitive silane coupling agent (A) which is protected by a hydrophobic photodegradable protecting group and is capable of generating a hydrophilic group selected from the group consisting of amino group, hydroxyl group, carboxyl group, and sulfo group,
wherein the photosensitive organic material generates amino group, hydroxyl group, carboxyl group, or sulfo group by the exposure, and
wherein the photosensitive silane coupling agent (A) is a photosensitive silane coupling agent (A1) represented by the following formula (1):

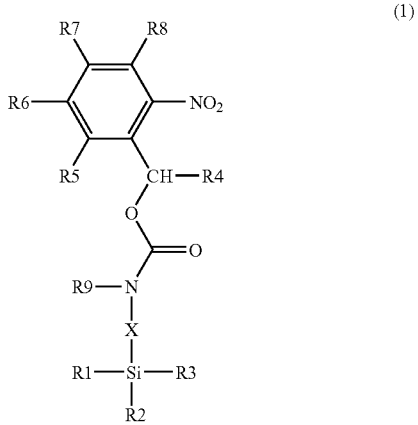

(1)

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; R4 represents hydrogen atom or alkyl group; R5, R6, R7, and R8 are selected from the group consisting of nitro group, hydrogen atom, halogen atom, alkyl group, alkyl group containing hydrogen atoms partially or entirely substituted with fluorine atom, and alkoxy group containing hydrogen atoms partially or entirely substituted with fluorine atom; and R9 represents hydrogen atom or alkyl group.

2. A pattern forming method, comprising:
a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;
a step of selectively exposing the photosensitive organic material layer to light in a pattern to generate the hydrophilic group at an exposed portion;
a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and
substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; R4 represents hydrogen atom or alkyl group; and R5, R6, R7, and R8 are selected from the group consisting of nitro group, hydrogen atom, halogen atom, alkyl group, alkyl group containing hydrogen atoms partially or entirely substituted with fluorine atom, and alkoxy group containing hydrogen atoms partially or entirely substituted with fluorine atom.

3. A pattern forming method, comprising:
a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;
a step of selectively exposing the photosensitive organic material layer to light in a pattern to generate the hydrophilic group at an exposed portion;
a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and
a step of removing one of the separated segments to form a pattern of the other segment,
wherein the photosensitive organic material is a photosensitive silane coupling agent (A) which is protected by a hydrophobic photodegradable protecting group and is capable of generating a hydrophilic group selected from the group consisting of amino group, hydroxyl group, carboxyl group, and sulfo group, wherein the photosensitive organic material generates amino group, hydroxyl group, carboxyl group, or sulfo group by the exposure, and wherein the photosensitive silane coupling agent (A) is a photosensitive silane coupling agent (A3) represented by the following formula (3):

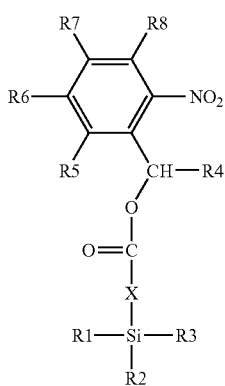

(3)

wherein X represents a divalent group selected from the group consisting of polymethylene group partially having hydrogen atom optionally substituted with fluorine atom or alkyl group, phenylene group partially having hydrogen atom optionally substituted with fluorine a step of removing one of the separated segments to form a pattern of the other segment, wherein the photosensitive organic material is a photosensitive silane coupling agent (A) which is protected by a hydrophobic photodegradable protecting group and is capable of generating a hydrophilic group selected from the group consisting of amino group, hydroxyl group, carboxyl group, and sulfo group, wherein the photosensitive organic material generates amino group, hydroxyl group, carboxyl group, or sulfo group by the exposure, and wherein the photosensitive silane coupling agent (A) is a photosensitive silane coupling agent (A2) represented by the following formula (2):

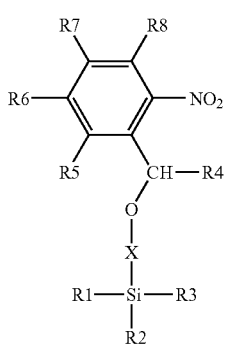

(2)

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; R4 represents hydrogen atom or alkyl group; and R5, R6, R7, and R8 are selected from the group consisting of nitro group, hydrogen atom, halogen atom, alkyl group, alkyl group containing hydrogen atoms partially or entirely substituted with fluorine atom, and alkoxy group containing hydrogen atoms partially or entirely substituted with fluorine atom.

4. A pattern forming method, comprising:

a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;

a step of selectively exposing the photosensitive organic material layer to light in a pattern to generate the hydrophilic group at an exposed portion;

a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and a step of removing one of the separated segments to form a pattern of the other segment, wherein the photosensitive organic material is a photosensitive silane coupling agent (A) which is protected by a hydrophobic photodegradable protecting group and is capable of generating a hydrophilic group selected from the group consisting of amino group, hydroxyl group, carboxyl group, and sulfo group, wherein the photosensitive organic material generates amino group, hydroxyl group, carboxyl group, or sulfo group by the exposure, and wherein the photosensitive silane coupling agent (A) is a photosensitive silane coupling agent (A4) represented by the following formula (4):

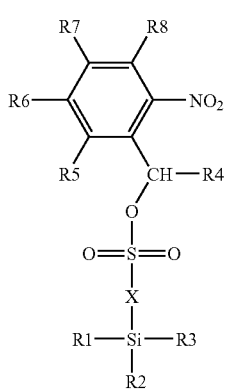

(4)

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; R4 represents hydrogen atom or alkyl group; and R5, R6, R7, and R8 are selected from the group consisting of nitro group, hydrogen atom, halogen atom, alkyl group, alkyl group containing hydrogen atoms partially or entirely substituted with fluorine atom, and alkoxy group containing hydrogen atoms partially or entirely substituted with fluorine atom.

5. A pattern forming method, comprising:
a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;
a step of selectively exposing the photosensitive organic material layer to light in a pattern to generate the hydrophilic group at an exposed portion;
a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and
a step of removing one of the separated segments to form a pattern of the other segment,
wherein the photosensitive organic material is a photosensitive silane coupling agent (A) which is protected by a hydrophobic photodegradable protecting group and is capable of generating a hydrophilic group selected from the group consisting of amino group, hydroxyl group, carboxyl group, and sulfo group,
wherein the photosensitive organic material generates amino group, hydroxyl group, carboxyl group, or sulfo group by the exposure, and
wherein the photosensitive silane coupling agent (A) is a photosensitive silane coupling agent (A5) represented by the following formula (5):

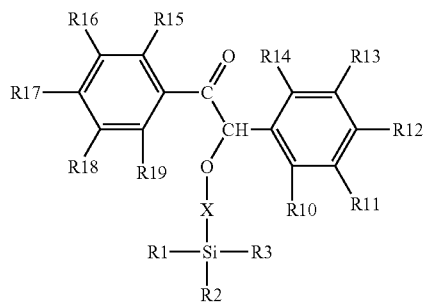

(5)

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; and R10 to R19 are selected from the group consisting of hydrogen atom, fluorine atom, alkoxy group, and thioalkoxy group.

6. A pattern forming method, comprising:
a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;
a step of selectively exposing the photosensitive organic material layer to light in a pattern to generate the hydrophilic group at an exposed portion;
a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and
a step of removing one of the separated segments to form a pattern of the other segment,
wherein the photosensitive organic material is a photosensitive silane coupling agent (A) which is protected by a hydrophobic photodegradable protecting group and is capable of generating a hydrophilic group selected from the group consisting of amino group, hydroxyl group, carboxyl group, and sulfo group,
wherein the photosensitive organic material generates amino group, hydroxyl group, carboxyl group, or sulfo group by the exposure, and
wherein the photosensitive silane coupling agent (A) is a photosensitive silane coupling agent (A6) represented by the following formula (6):

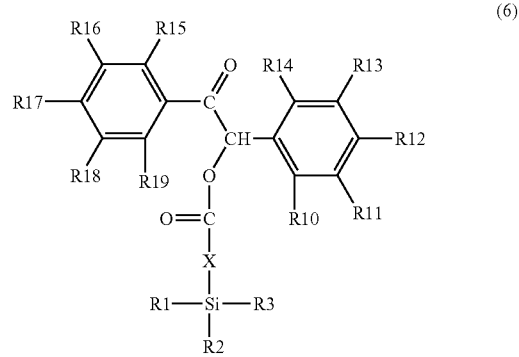

(6)

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; and R10 to R19 are selected from the group consisting of hydrogen atom, fluorine atom, alkoxy group, and thioalkoxy group.

7. A pattern forming method, comprising:
a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;
a step of selectively exposing the photosensitive organic material layer to light in a pattern to generate the hydrophilic group at an exposed portion;
a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and
a step of removing one of the separated segments to form a pattern of the other segment,
wherein the photosensitive organic material is a photosensitive silane coupling agent (A) which is protected by a hydrophobic photodegradable protecting group and is capable of generating a hydrophilic group selected from the group consisting of amino group, hydroxyl group, carboxyl group, and sulfo group,
wherein the photosensitive organic material generates amino group, hydroxyl group, carboxyl group, or sulfo group by the exposure, and
wherein the photosensitive silane coupling agent (A) is a photosensitive silane coupling agent (A7) represented by the following formula (7):

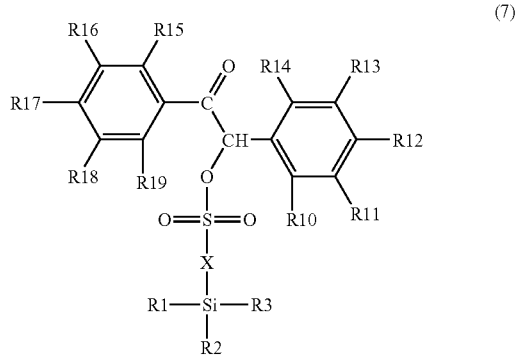

(7)

wherein X represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; at least one of R1, R2, and R3 represents alkoxy group or halogen atom and the remainder of R1, R2 and R3 is selected from the group consisting of alkoxy group, halogen atom, alkyl group, and hydrogen atom; and R10 to R19 are selected from the group consisting of hydrogen atom, fluorine atom, alkoxy group, and thioalkoxy group.

8. A pattern forming method, comprising:
a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;
a step of selectively exposing the photosensitive organic material layer to light in a pattern to generate the hydrophilic group at an exposed portion;
a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and
a step of removing one of the separated segments to form a pattern of the other segment,
wherein the photosensitive organic material is a photosensitive silane coupling agent (B) containing 1,2 naphthoquinone 2 diazide 5 sulfonyl group or 1,2 naphthoquinone 2 diazide 4 sulfonyl group and generates carboxyl group by the exposure, and
wherein the photosensitive silane coupling agent (B) is a photosensitive silane coupling agent (B1) represented by the following formula (8):

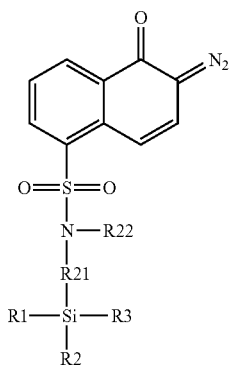

(8)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of alkylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R22 represents hydrogen atom or alkyl group.

9. A pattern forming method, comprising:
a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;
a step of selectively exposing the photosensitive organic material layer to light in a pattern to generate the hydrophilic group at an exposed portion;
a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and
a step of removing one of the separated segments to form a pattern of the other segment,
wherein the photosensitive organic material is a photosensitive silane coupling agent (B) containing 1,2 naphthoquinone 2 diazide 5 sulfonyl group or 1,2 naphthoquinone 2 diazide 4 sulfonyl group and generates carboxyl group by the exposure, and
wherein the photosensitive silane coupling agent (B) is a photosensitive silane coupling agent (B2) represented by the following formula (9):

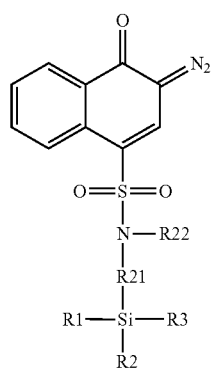

(9)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of alkylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R22 represents hydrogen atom or alkyl group.

10. A pattern forming method, comprising:
a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;
a step of selectively exposing the photosensitive organic material layer to light in a pattern to generate the hydrophilic group at an exposed portion;
a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and
a step of removing one of the separated segments to form a pattern of the other segment,
wherein the photosensitive organic material is a photosensitive silane coupling agent (B) containing 1,2 naphthoquinone 2 diazide 5 sulfonyl group or 1,2 naphthoquinone 2 diazide 4 sulfonyl group and generates carboxyl group by the exposure, and
wherein the photosensitive silane coupling agent (B) is a photosensitive silane coupling agent (B3) represented by the following formula (10):

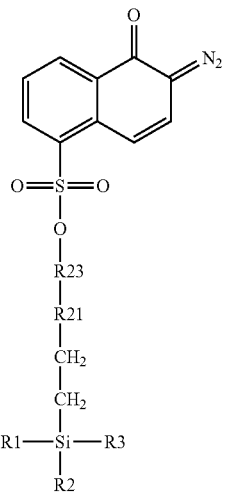

(10)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of alkylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R23 represents methylene group partially having hydrogen atom optionally substituted with fluorine atom or alkyl group, or alkylene group partially having hydrogen atom optionally substituted with fluorine atom or alkyl group.

11. A pattern forming method, comprising:
a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;

a step of selectively exposing the photosensitive organic material layer to light in a pattern to generate the hydrophilic group at an exposed portion;

a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and a step of removing one of the separated segments to form a pattern of the other segment, wherein the photosensitive organic material is a photosensitive silane coupling agent (B) containing 1,2 naphthoquinone 2 diazide 5 sulfonyl group or 1,2 naphthoquinone 2 diazide 4 sulfonyl group and generates carboxyl group by the exposure, and wherein the photosensitive silane coupling agent (B) is a photosensitive silane coupling agent (B4) represented by the following formula (11):

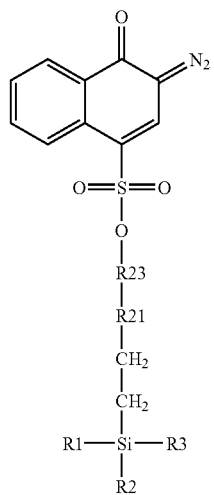

(11)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of polymethylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R23 represents methylene group partially having hydrogen atom optionally substituted with fluorine atom or alkyl group, or alkylene group partially having hydrogen atom optionally substituted with fluorine atom or alkyl group.

12. A pattern forming method, comprising:

a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;

a step of selectively exposing the photosensitive organic material layer to light in a pattern to generate the hydrophilic group at an exposed portion;

a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and a step of removing one of the separated segments to form a pattern of the other segment, wherein the photosensitive organic material is a photosensitive silane coupling agent (B) containing 1,2 naphthoquinone 2 diazide 5 sulfonyl group or 1,2 naphthoquinone 2 diazide 4 sulfonyl group and generates carboxyl group by the exposure, and wherein the photosensitive silane coupling agent (B) is a photosensitive silane coupling agent (B5) represented by the following formula (12):

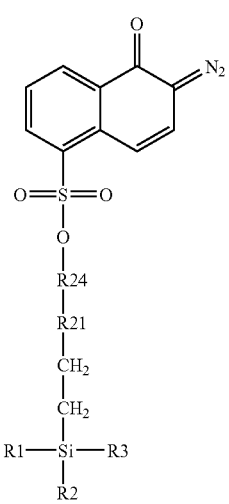

(12)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of alkylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R24 represents phenylene group partially having hydrogen atom optionally substituted with fluorine atom or alkyl group, or naphthylene group partially having hydrogen atom optionally substituted with fluorine atom or alkyl group.

13. A pattern forming method, comprising:

a step of forming a photosensitive organic material layer by providing, on a substrate, a photosensitive organic material which is protected by a hydrophobic photodegradable group and is capable of generating a hydrophilic group selected from the group consisting of amino group, hydroxyl group, carboxyl group, and sulfo group by light irradiation;

a step of selectively exposing the photosensitive organic material layer to light in a pattern to generate the hydrophilic group at an exposed portion;

a step of providing a block polymer having a hydrophilic segment and a hydrophobic segment, on the photosensitive organic material layer after the exposure, to separate segments of the block polymer into the hydrophilic segment at a portion where the hydrophilic group generated by the exposure is present and the hydrophobic segment at a portion where the hydrophilic group is not present; and a step of removing one of the separated segments to form a pattern of the other segment, wherein the photosensitive organic material is a photosensitive silane coupling agent (B) containing 1,2 naphthoquinone 2 diazide 5 sulfonyl group or 1,2 naphthoquinone 2 diazide 4 sulfonyl group and generates carboxyl group by the exposure, and wherein the photosensitive silane coupling agent (B) is a photosensitive silane coupling agent (B6) represented by the following formula (13):

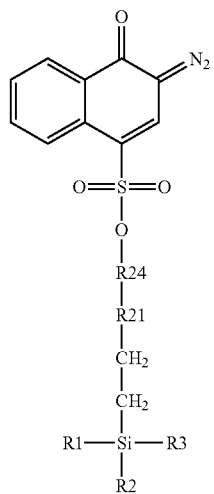

(13)

wherein at least one of R1, R2, and R3 represents alkoxy group or halogen atom and the remainder of R1, R2 and R3 is selected from the group consisting of alkoxy group, halogen atom, alkyl group, and hydrogen atom; R21 represents a divalent group selected from the group consisting of alkylene group partially having hydrogen atom optionally substituted with fluorine atom or alkyl group, phenylene group partially having hydrogen atom optionally substituted with fluorine atom or alkyl group, naphthylene group partially having hydrogen atom optionally substituted with fluorine atom or alkyl group, and a divalent group having a linked structure of a plurality of these groups; and R24 represents phenylene group partially having hydrogen atom optionally substituted with fluorine atom or alkyl group, or naphthylene group partially having hydrogen atom optionally substituted with fluorine atom or alkyl group.

14. A method according to any one of claims 1 to 13, wherein the hydrophilic segment of the block polymer comprises polymethyl methacrylate, polymethacrylic acid, or polyhydroxyethyl methacrylate, and the hydrophobic segment of the block polymer comprises polystyrene or polydimethylsiloxane.

15. A method according to any one of claims 1 to 13, wherein the exposure in the pattern is effected by using near field light generated from an exposure mask including a light blocking layer having an opening smaller than a wavelength of light from an exposure light source.

16. A process for producing a device, comprising:

forming a pattern on a substrate by a pattern forming method according to any one of claims 1 to 13; and subjecting the substrate to etching by using the pattern as a mask to produce a device on the substrate.

* * * * *